US012628680B2

(12) United States Patent
Peng et al.

(10) Patent No.: US 12,628,680 B2
(45) Date of Patent: May 12, 2026

(54) IN-MOLD ELECTRONICS DEVICE

(71) Applicant: Industrial Technology Research Institute, Hsinchu (TW)

(72) Inventors: Yu-Ming Peng, Taichung City (TW); Hsiao-Fen Wei, New Taipei City (TW); Chih-Chia Chang, Hsinchu County (TW)

(73) Assignee: Industrial Technology Research Institute, Hsinchu (CN)

( * ) Notice: Subject to any disclaimer, the term of this patent is extended or adjusted under 35 U.S.C. 154(b) by 361 days.

(21) Appl. No.: 18/360,813

(22) Filed: Jul. 28, 2023

(65) Prior Publication Data

US 2024/0112969 A1     Apr. 4, 2024

Related U.S. Application Data

(60) Provisional application No. 63/402,481, filed on Aug. 31, 2022.

(30) Foreign Application Priority Data

Jun. 9, 2023     (TW) .................................. 112121748

(51) Int. Cl.
*H01L 23/14*          (2006.01)
*H01L 23/13*          (2006.01)
(Continued)

(52) U.S. Cl.
CPC ............ *H01L 23/145* (2013.01); *H01L 23/13* (2013.01); *H01L 23/528* (2013.01); *H01L 23/53204* (2013.01)

(58) Field of Classification Search
None
See application file for complete search history.

(56) References Cited

U.S. PATENT DOCUMENTS 5,461,774 A * 10/1995 Holmes ................ H05K 3/0061
174/16.3
6,392,143 B1 * 5/2002 Koshio ................. H01L 21/563
174/254

(Continued)

FOREIGN PATENT DOCUMENTS

| CN | 113342187 | 9/2021 |
| TW | 201936034 | 9/2019 |

(Continued)

OTHER PUBLICATIONS

"Office Action of Taiwan Counterpart Application", issued on Feb. 6, 2024, p. 1-p. 3.

*Primary Examiner* — Nishath Yasmeen
(74) *Attorney, Agent, or Firm* — JCIPRNET

(57)          ABSTRACT

An in-mold electronic (IME) device includes a curved substrate, a first conductive layer, a dielectric layer, a gap compensation layer, and a second conductive layer. The curved substrate has a first surface. The first conductive layer is disposed on the first surface. The dielectric layer is disposed on the first conductive layer and has a first thickness. The gap compensation layer is disposed on the first surface and connected to the dielectric layer. The gap compensation layer has a second thickness. The second conductive layer is disposed on the gap compensation layer and electrically connected to the gap compensation layer. A curvature radius of the curved substrate is c, a ratio of the second thickness to the first thickness is r, and c and r satisfy a relationship: r=(1.5−0.02c)±15%.

16 Claims, 6 Drawing Sheets

(51) Int. Cl.
    *H01L 23/528*     (2006.01)
    *H01L 23/532*     (2006.01)

(56)             References Cited

U.S. PATENT DOCUMENTS

| | | | | |
|---|---|---|---|---|
| 7,224,716 | B2 * | 5/2007 | Roman | H04J 13/107 |
| | | | | 370/503 |
| 9,171,794 | B2 * | 10/2015 | Rafferty | H01L 23/4985 |
| 9,349,684 | B2 * | 5/2016 | Kim | H01L 23/4985 |
| 10,141,199 | B2 * | 11/2018 | Rimbert-Riviere | |
| | | | | H01L 21/4882 |
| 2006/0273304 | A1 * | 12/2006 | Cok | H10K 50/841 |
| | | | | 438/26 |
| 2009/0002973 | A1 * | 1/2009 | Watanabe | H05K 1/023 |
| | | | | 361/820 |
| 2009/0107703 | A1 * | 4/2009 | Abe | H05K 1/0271 |
| | | | | 174/254 |
| 2015/0003083 | A1 | 1/2015 | Uehara | |
| 2017/0062241 | A1 * | 3/2017 | Rimbert-Riviere | |
| | | | | H01L 21/4882 |
| 2020/0098716 | A1 * | 3/2020 | Min | H01L 21/561 |
| 2021/0345490 | A1 | 11/2021 | Jaw et al. | |

FOREIGN PATENT DOCUMENTS

| | | |
|---|---|---|
| TW | 202147700 | 12/2021 |
| TW | 202203255 | 1/2022 |

* cited by examiner

B

122(120)

B'

150a

140a

130

110

Y

Z

X

100a $150a \begin{cases} 151a \\ 152a \end{cases}$

IN-MOLD ELECTRONICS DEVICE

CROSS-REFERENCE TO RELATED APPLICATION

This application claims the priority benefit of U.S. provisional application Ser. No. 63/402,481, filed on Aug. 31, 2022, and Taiwan application serial no. 112121748, filed on Jun. 9, 2023. The entirety of each of the above-mentioned patent applications is hereby incorporated by reference herein and made a part of this specification.

TECHNICAL FIELD

The disclosure relates to an in-mold electronic (IME) device having a gap compensation layer.

BACKGROUND

In an in-mold electronic (IME) device, if there is a structural gap (e.g., a structural gap among a substrate/an insulation dielectric layer/a metal conductive trace) in a multi-layer heterogeneous stacked structure, after a thermo-forming process is performed, it is prone to raise an issue of an abnormal interface structure (e.g., peeling or wrinkles) at the structural gap, which may affect reliability of the IME device.

SUMMARY

One of the exemplary embodiments provides an in-mold electronic (IME) device capable of mitigating an issue of an abnormal interface (e.g., peeling or wrinkles) by arranging a gap compensation layer, thereby improving reliability.

In an embodiment of the disclosure, an IME device including a curved substrate, a first conductive layer, a dielectric layer, a gap compensation layer, and a second conductive layer is provided. The curved substrate has a first surface. The first conductive layer is disposed on the first surface. The dielectric layer is disposed on the first conductive layer and has a first thickness. The gap compensation layer is disposed on the first surface, connected to the dielectric layer, and has a second thickness. The second conductive layer is disposed on the gap compensation layer and electrically connected to the gap compensation layer. A curvature radius of the curved substrate is c, a ratio of the second thickness to the first thickness is r, and c and r satisfy a relationship: $r=(1.5-0.02c)\pm15\%$.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

2

Figure 2A:
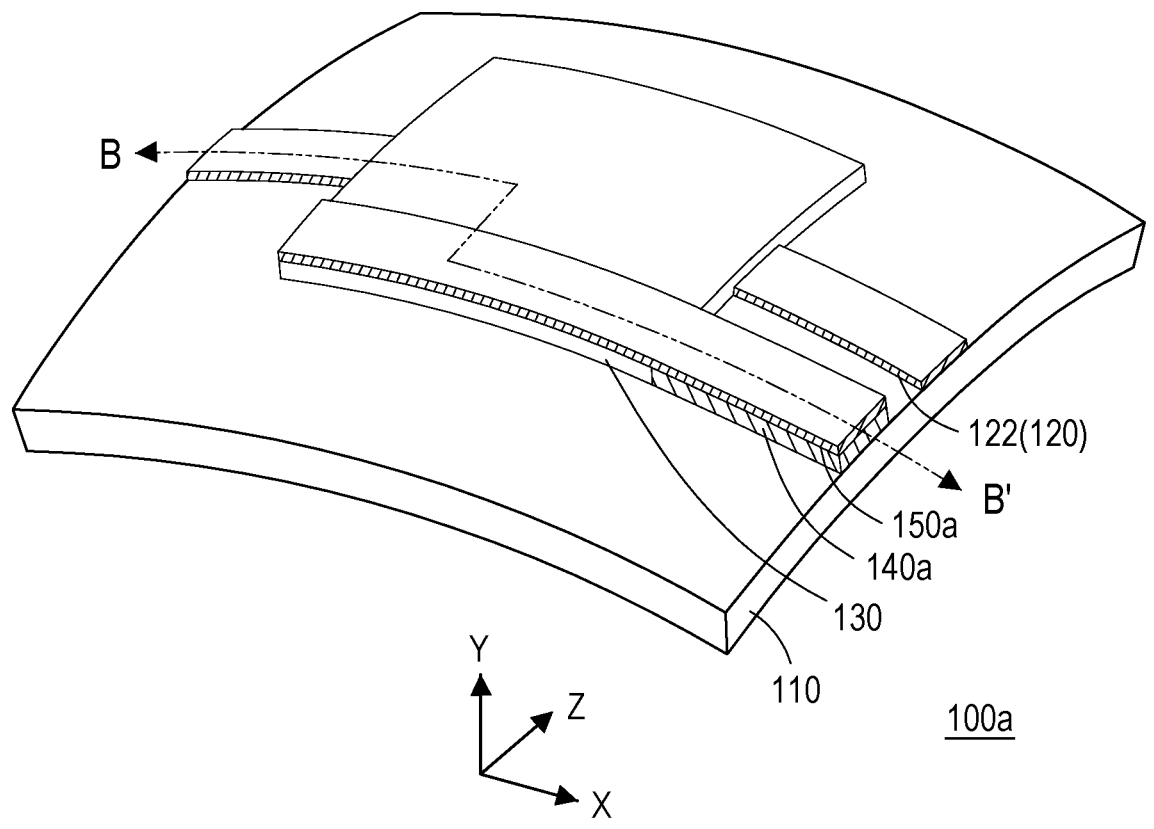
FIG. 2A is a schematic three-dimensional view illustrating an IME device according to another embodiment of the disclosure.
Figure 2B:
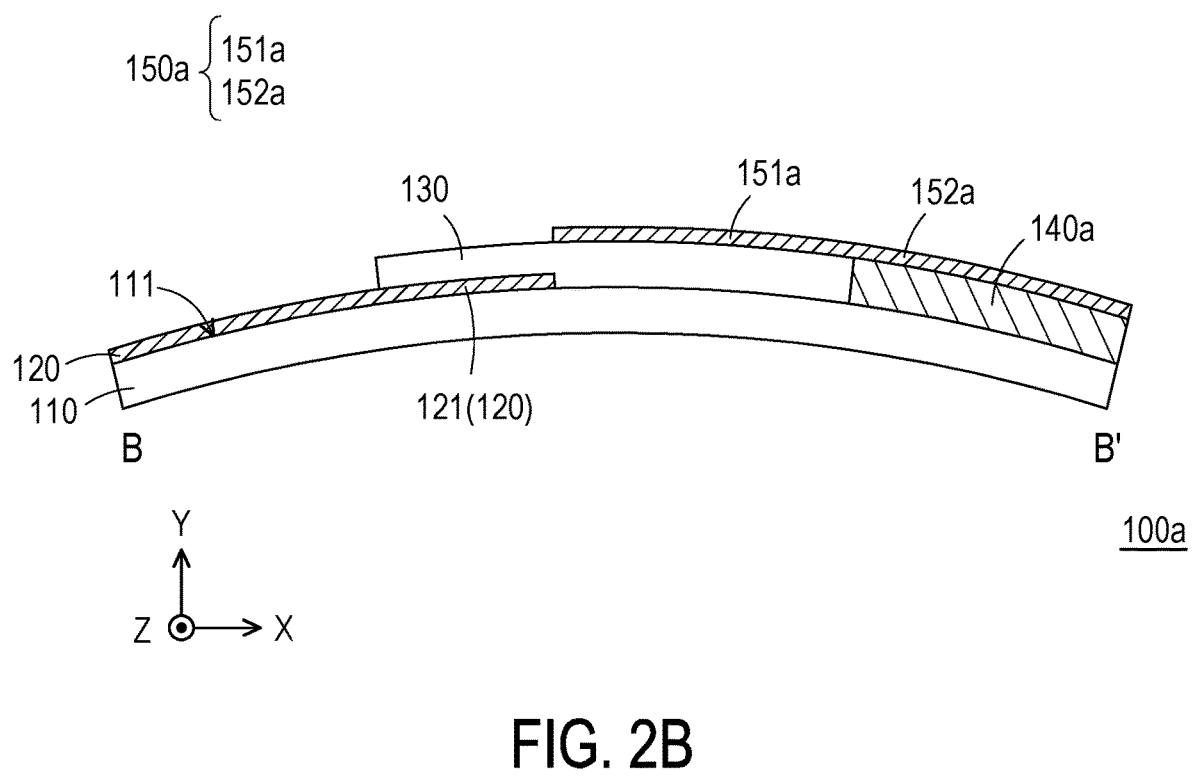

FIG. 2B is a schematic cross-sectional schematic view illustrating the IME device depicted in FIG. 2A along a sectional line B-B'.

Figure 3A:
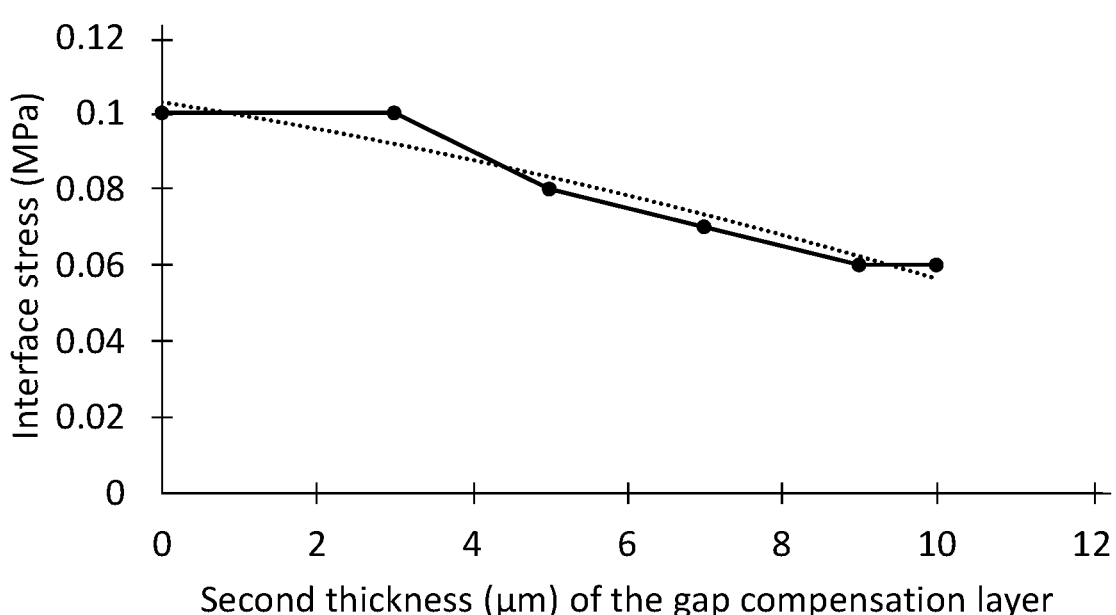

FIG. 3A illustrates a first correlation between a second thickness of a gap compensation layer and an interface stress according to embodiments 1-6.

Figure 3B:
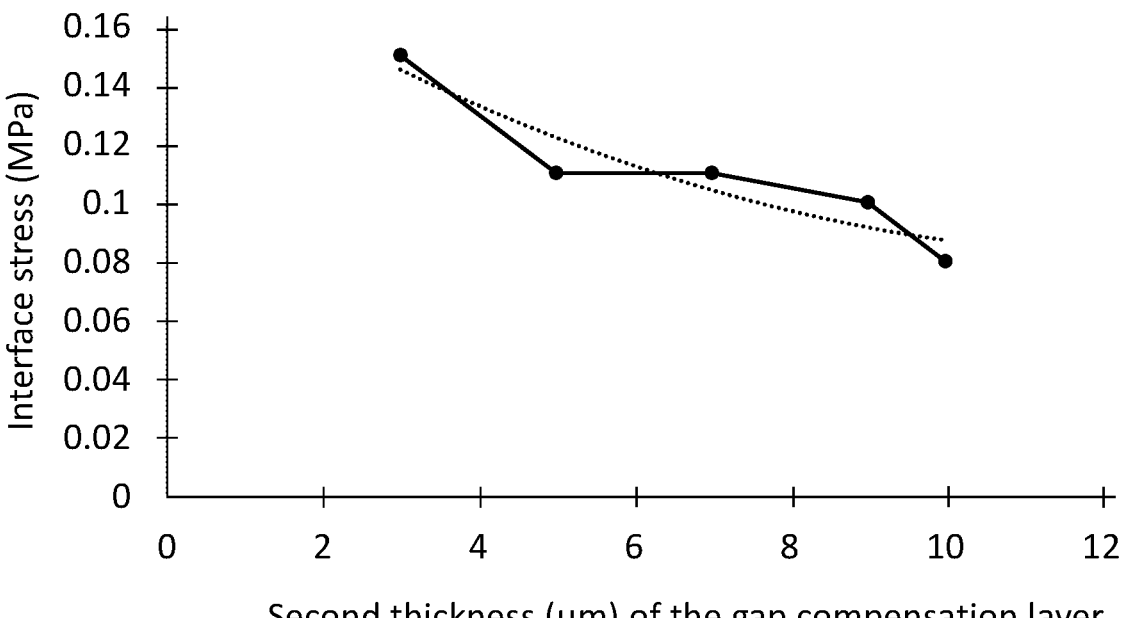

FIG. 3B illustrates a first correlation between a second thickness of a gap compensation layer and an interface stress according to embodiments 7-11.

Figure 3C:
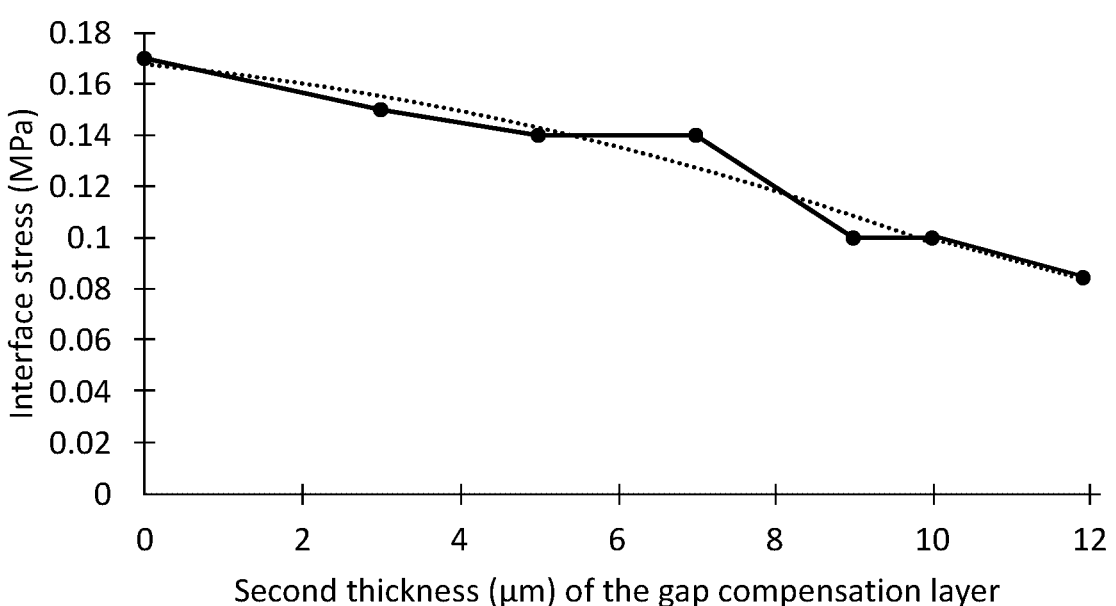

FIG. 3C illustrates a first correlation between a second thickness of a gap compensation layer and an interface stress according to embodiments 12-18.

Figure 4:
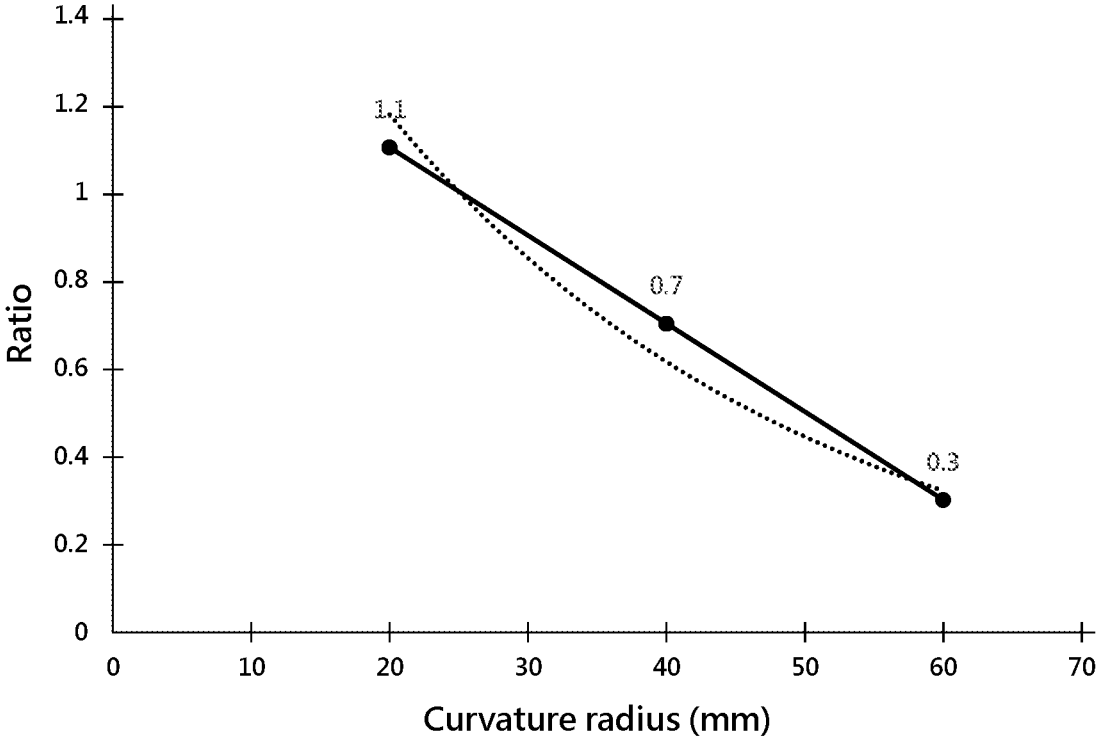

FIG. 4 illustrates a second correlation between a curvature radius and a ratio of a second thickness of a gap compensation layer to a first thickness of a dielectric layer.

DETAILED DESCRIPTION OF DISCLOSURED EMBODIMENTS

Figure 1A:
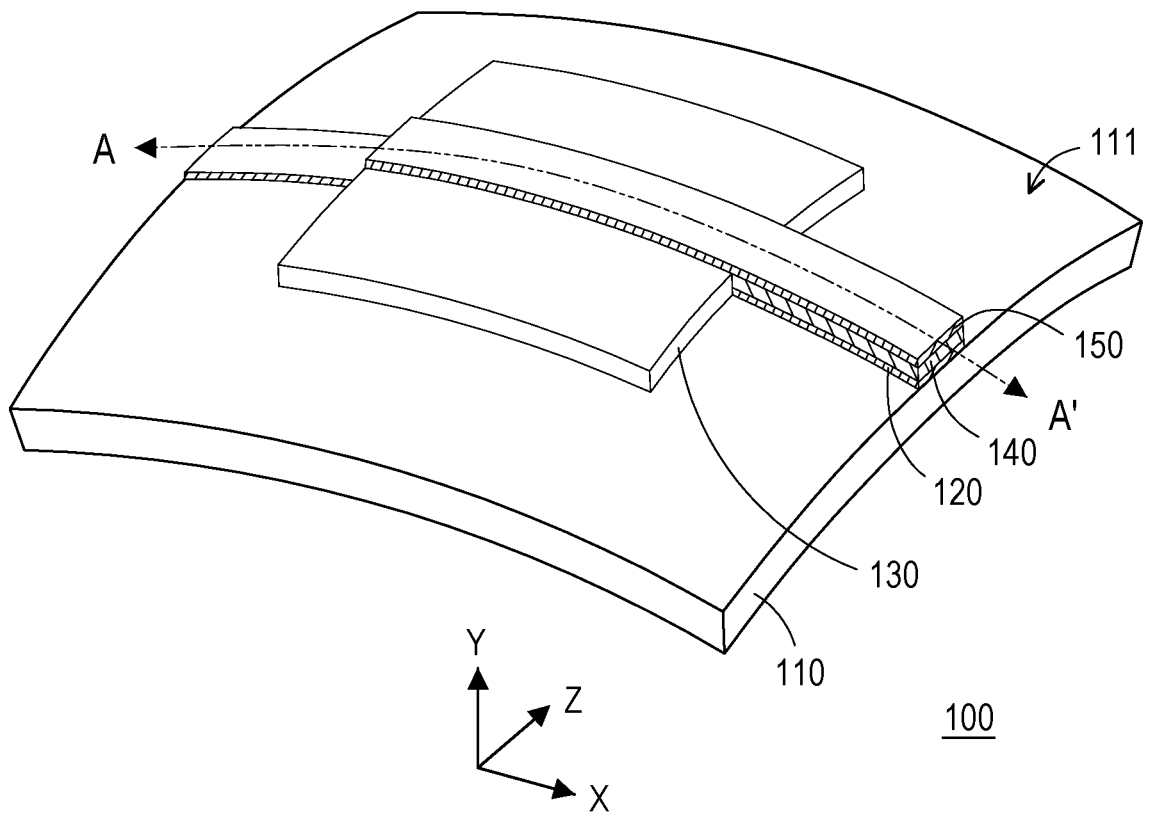
FIG. 1A is a schematic three-dimensional view illustrating an in-mold electronic (IME) device according to an embodiment of the disclosure.
Figure 1B:
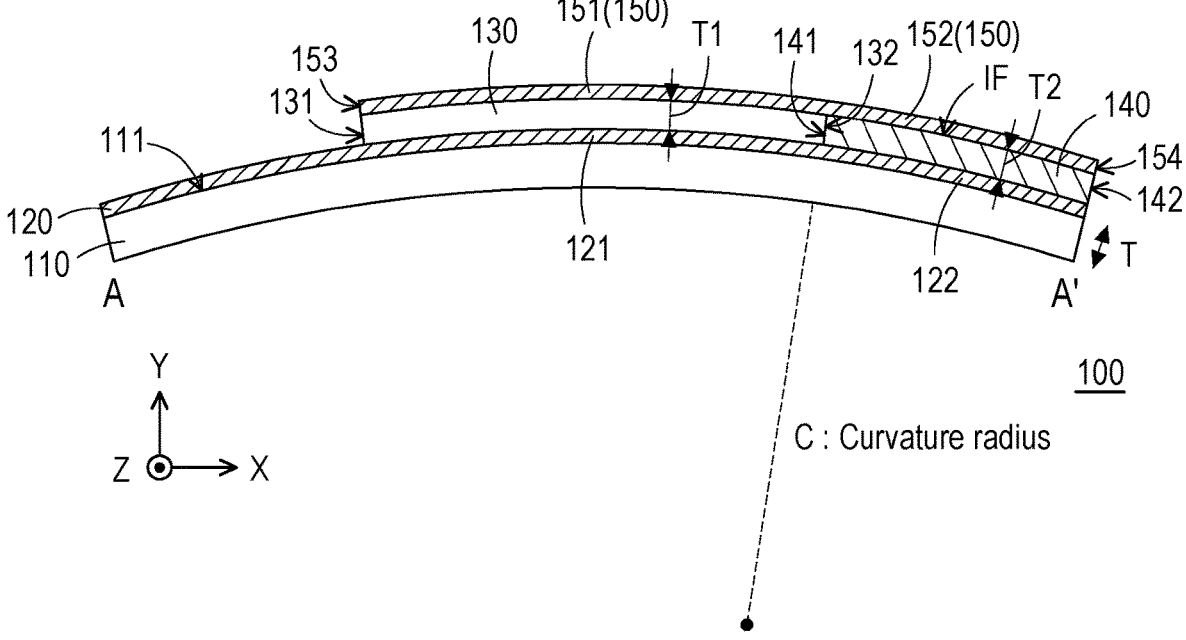
FIG. 1B is a schematic cross-sectional schematic view illustrating the IME device depicted in FIG. 1A along a sectional line A-A'.

FIG. 1A is a schematic three-dimensional view illustrating an in-mold electronic (TME) device according to an embodiment of the disclosure. FIG. 1B is a schematic cross-sectional schematic view illustrating the TME device depicted in FIG. 1A along a sectional line A-A'.

With reference to FIG. 1A and FIG. 1B, an in-mold electronic (TME) device 100 provided in this embodiment includes a curved substrate 110, a first conductive layer 120, a dielectric layer 130, a gap compensation layer 140, and a second conductive layer 150. The curved substrate 110 has a first surface 111. The first surface 111 may be a convex surface, a concave surface, or a combination thereof, which should however not be construed as a limitation in the disclosure. The curved substrate 110 may be a plastic substrate containing a plastic material, which should however not be construed as a limitation in the disclosure. A material of the curved substrate 110 may include polyethylene terephthalate (PET), poly (ethylene terephthalateco-1,4-cylclohexylenedimethylene terephthalate) (PETG), polycarbonate (PC), polyimide (PI), polymethylmethacrylate (PMMA), polyethersulfone (PES), polydimethylsiloxane (PDMS), acrylonitrile-butadiene-styrene (ABS) copolymer, acrylic, or a combination thereof, which should however not be construed as a limitation in the disclosure.

In this embodiment, the curved substrate 110 has a curvature radius c, and the curvature radius c may be, for instance, less than or equal to 60 millimeters (mm), which should however not be construed as a limitation in the disclosure. For instance, the curvature radius c of the curved substrate 110 may be 20 mm, 25 mm, 30 mm, 35 mm, 40 mm, 45 mm, 50 mm, 55 mm, or 60 mm, which should however not be construed as a limitation in the disclosure.

In this embodiment, a thickness T of the curved substrate 110 may be, for instance, 0.1 mm to 5 mm, which should however not be construed as a limitation in the disclosure. In this embodiment, a Young's modulus of the curved substrate 110 may be, for instance, 0.5 GPa to 20 GPa, which should however not be construed as a limitation in the disclosure.

In this embodiment, X, Y, and Z directions in FIG. 1A and FIG. 1B are different directions, respectively. The X direction is, for instance, an extension direction of the sectional line A-A', and the Y direction is, for instance, a normal direction of the IME device 100. The X direction is substantially perpendicular to the Y direction, and the X and Y directions are respectively substantially perpendicular to the Z direction, which should however not be construed as a limitation in the disclosure.

In this embodiment, the first conductive layer 120 is disposed on the first surface 111 of the curved substrate 110. A material of the first conductive layer 120 may include gold, silver, copper, aluminum, nickel, tin, an alloy thereof, or a combination thereof, which should however not be construed as a limitation in the disclosure.

In this embodiment, the dielectric layer 130 is disposed on the first conductive layer 120 to cover one portion 121 of the first conductive layer 120 and expose the other portion 122 of the first conductive layer 120. The dielectric layer 130 has side surfaces 131 and 132 that are opposite to each other, where the side surface 131 is away from the gap compensation layer 140, and the side surface 132 contacts and connects the gap compensation layer 140. The dielectric layer 130 has a first thickness T1. A material of the dielectric layer 130 may include acrylic, epoxy resin, phenol, polyester, urethane, silicone, or PI, which should however not be construed as a limitation in the disclosure.

In this embodiment, the gap compensation layer 140 is disposed on the first surface 111 of the curved substrate 110. The gap compensation layer 140 is disposed on the other portion 122 of the first conductive layer 120. The gap compensation layer 140 may contact the other portion 122 of the first conductive layer 120, and the gap compensation layer 140 may overlap the other portion 122 of the first conductive layer 120 in the Y direction. The gap compensation layer 140 is disposed between the second conductive layer 150 and the first conductive layer 120. A material of the gap compensation layer 140 may include silver, aluminum, or other appropriate metals, which should however not be construed as a limitation in the disclosure.

In this embodiment, the gap compensation layer 140 has opposite side surfaces 141 and 142, where the side surface 141 of the gap compensation layer 140 may contact and connect the side surface 132 of the dielectric layer 130, and the side surface 142 is away from the dielectric layer 130. The gap compensation layer 140 has a second thickness T2.

In this embodiment, a ratio of the second thickness T2 of the gap compensation layer 140 to the first thickness T1 of the dielectric layer 130 is r, and the curvature radius c and the ratio r may satisfy the following relationship: $r=(1.5-0.02c)\pm15\%$, which should however not be construed as a limitation in the disclosure.

In this embodiment, the second conductive layer 150 is disposed on the dielectric layer 130 and the gap compensation layer 140. The second conductive layer 150 includes a first portion 151 that may overlap the dielectric layer 130 in the Y direction and a second portion 152 that does not overlap the dielectric layer 130 in the Y direction, where the first portion 151 may further overlap the first conductive layer 120 in the Y direction, and the second portion 152 may further overlap the gap compensation layer 140 in the Y direction. The gap compensation layer 140 is disposed between the second portion 152 of the second conductive layer 150 and the other portion 122 of the first conductive layer 120.

In this embodiment, there is an interface IF or a seam between the second conductive layer 150 and the gap compensation layer 140. A material of the second conductive layer 150 may include gold, silver, copper, aluminum, nickel, tin, an alloy thereof, or a combination thereof, which should however not be construed as a limitation in the disclosure. In some embodiments, the first conductive layer 120, the second conductive layer 150, and the gap compensation layer 140 may have the same material.

In this embodiment, the second conductive layer 150 may be electrically connected to the gap compensation layer 140.

The second conductive layer 150 may be electrically connected to the first conductive layer 120 through the gap compensation layer 140, so that the second conductive layer 150 and the first conductive layer 120 may transmit the same signal. In this embodiment, the second conductive layer 150 has a first side surface 153 and a second side surface 154 that are opposite to each other, where the first side surface 153 is aligned with the side surface 131 of the dielectric layer 130 away from the gap compensation layer 140, and the second side surface 154 is aligned with the side surface 142 of the gap compensation layer 140 away from the dielectric layer 130.

In this embodiment, a method of manufacturing the IME device 100 may include but is not limited to following steps. A flat substrate (or a non-curved substrate) (not shown) is provided, where the flat substrate has the first surface 111. The first conductive layer 120 is formed on the first surface 111 of the flat substrate. The dielectric layer 130 is formed on the first conductive layer 120 to cover one portion 121 of the first conductive layer 120 and expose the other portion 122 of the first conductive layer 120. The gap compensation layer 140 is formed on the other portion 122 of the first conductive layer 120, so that the gap compensation layer 140 may contact the first conductive layer 120 and connect the dielectric layer 130. The second conductive layer 150 is formed on the dielectric layer 130 and the gap compensation layer 140, so that the second conductive layer 150 may overlap the first conductive layer 120 and the gap compensation layer 140 in the Y direction, and the second conductive layer 150 may be electrically connected to the first conductive layer 120 through the gap compensation layer 140. A thermoforming process is performed to bend the flat substrate into the curved substrate 110, and the curved substrate 110 is configured to be disposed on a mold with a curved surface (including a convex surface, a concave surface, or a combination thereof). So far, the IME device 100 provided in this embodiment is substantially formed.

Although there is a structural gap in a stacked structure of the second conductive layer 150, the dielectric layer 130, and the first conductive layer 120 in the IME device 100 provided in this embodiment, the issue of an abnormal interface structure (e.g., peeling or wrinkles) caused by the thermoforming process at the structural gap may be mitigated by arranging the gap compensation layer 140 and ensuring the second thickness T2 of the gap compensation layer 140 to satisfy the relationship: $r=(1.5-0.02c)\pm15\%$ (where r is the ratio of the second thickness T2 of the gap compensation layer 140 to the first thickness T1 of the dielectric layer 130, and c is the curvature radius of the curved substrate 110), thereby improving the reliability of the IME device 100 provided in this embodiment.

Besides, in some embodiments, the issue of the abnormal interface structure (e.g., peeling or wrinkles) caused by the thermoforming process at the structural gap may be mitigated by arranging the gap compensation layer 140 between the second portion 152 of the second conductive layer 150 and the other portion 122 of the first conductive layer 120, so that the second portion 152 of the second conductive layer 150 may overlap the gap compensation layer 140 in the Y direction, and the second side surface 154 of the second conductive layer 150 may be aligned with the side surface 142 of the gap compensation layer 140 away from the dielectric layer 130. As such, the IME device 100 having the gap compensation layer 140 may have the improved reliability.

Other embodiments are provided hereinafter for further explanation. Note that the reference numbers and a part of the contents in the previous embodiment are used in the following embodiments, in which identical reference numbers indicate identical or similar components, and the description of similar technical content should be referenced to the above-mentioned embodiments and thus will not be repeated in the following embodiments.

FIG. 2A is a schematic three-dimensional view illustrating an IME device according to another embodiment of the disclosure. FIG. 2B is a schematic cross-sectional schematic view illustrating the IME device depicted in FIG. 2A along a sectional line B-B'. With reference to FIG. 1A, FIG. 1B, FIG. 2A, and FIG. 2B, an IME device 100a provided in this embodiment is similar to the IME device 100 depicted in FIG. 1A, while the main difference between the two lies in that a second conductive layer 150a of the IME device 100a provided in this embodiment is not electrically connected to the first conductive layer 120.

Specifically, as shown in FIG. 2A and FIG. 2B, in this embodiment, a gap compensation layer 140a is disposed on the first surface 111 of the curved substrate 110. The gap compensation layer 140a may contact the first surface 111 of the curved substrate 110. The gap compensation layer 140a overlaps the second conductive layer 150a in the Y direction, and the gap compensation layer 140a does not overlap the other portion 122 of the first conductive layer 120 in the Y direction.

In this embodiment, the second conductive layer 150a includes a first portion 151a that may overlap the dielectric layer 130 in the Y direction and a second portion 152a that does not overlap the dielectric layer 130 in the Y direction, where the first portion 151a does not overlap the first conductive layer 120 in the Y direction, and the second portion 152a may further overlap the gap compensation layer 140a in the Y direction. The gap compensation layer 140a is disposed between the second portion 152a of the second conductive layer 150a and the first surface 111 of the curved substrate 110.

In this embodiment, since the second conductive layer 150a is not electrically connected to the first conductive layer 120 (i.e., the second conductive layer 150a is electrically independent from the first conductive layer 120), the second conductive layer 150a and the first conductive layer 120 may transmit different signals, respectively.

A correlation between the curvature radius c and the first and second thicknesses T1 and T2 defined in the IME device provided in the previous embodiment is described below in detail through experimental examples (i.e., the relationship: r=(1.5−0.02c)±15%, which may explain the effect of mitigating the issue of the abnormal interface structure (e.g., peeling or wrinkles). However, the following experimental examples should not be construed as limitations in the disclosure.

Experimental Example 1

In this experimental example, changes in an interface stress of the MIE device in different embodiments (Embodiments 1-18) are measured to obtain a first correlation between the second thickness T2 of the gap compensation layer in the IME device and the interface stress S and a second correlation between the curvature radius c of the curved substrate and the first thickness T1 of the first conductive layer and the second thickness T2 of the second conductive layer in the IME device. In this experimental example, when the interface stress S is greater than 0.1 MPa, it indicates that the issue of the abnormal interface structure (e.g., peeling, wrinkles, and so on) is present.

In Embodiments 1-18, the material of the curved substrate is PC with a thickness of 0.5 mm, the material of the dielectric layer is silicone, and the materials of the first conductive layer, the second conductive layer, and the gap compensation layer are silver. Here, the curvature radius c of the curved substrate, the first thickness T1 of the dielectric layer, the thickness of the first conductive layer, the second thickness T2 of the gap compensation layer, and the thickness of the second conductive layer applied in different embodiments are all recorded in Table 1. The results of the interface stress S measured in different embodiments are also recorded in Table 1.

TABLE 1

| Embodiment | c (mm) | T1 (μm) | Thickness of the first conductive layer (μm) | T2 (μm) | Thickness of the second conductive layer (μm) | S (Mpa) |
|---|---|---|---|---|---|---|
| 1 | 60 | 10 | 10 | 0 | 10 | 0.1 |
| 2 | | | | 3 | | 0.1 |
| 3 | | | | 5 | | 0.08 |
| 4 | | | | 7 | | 0.07 |
| 5 | | | | 9 | | 0.06 |
| 6 | | | | 10 | | 0.06 |
| 7 | 40 | 10 | 10 | 3 | 10 | 0.15 |
| 8 | | | | 5 | | 0.11 |
| 9 | | | | 7 | | 0.11 |
| 10 | | | | 9 | | 0.1 |
| 11 | | | | 10 | | 0.08 |
| 12 | 20 | 10 | 10 | 0 | 10 | 0.17 |
| 13 | | | | 3 | | 0.15 |
| 14 | | | | 5 | | 0.14 |
| 15 | | | | 7 | | 0.14 |
| 16 | | | | 9 | | 0.1 |
| 17 | | | | 10 | | 0.1 |
| 18 | | | | 12 | | 0.08 |

Based on the results shown in Table 1, the correlations between the second thickness T2 of the gap compensation layer and the corresponding interface stress S in Embodiments 1-6 are plotted as a first correlation graph shown in FIG. 3A. Next, according to the first correlation graph, a first regression curve (the dotted line in FIG. 3A) is drawn, and an equation of the first regression curve (i.e., the first relationship between the second thickness T2 of the gap compensation layer and the interface stress S) is calculated as $S=-0.0001 \times T2^2-0.0032 \times T2+0.1029$. From the first relationship, it may be learned that when the curvature radius c of the curved substrate in the IME device is 60 mm and the first thickness T1 of the dielectric layer is 10 micrometers (m), the second thickness T2 of the gap compensation layer should be at least 3 μm to avoid the interface stress S from being greater than 0.1 MPa. In other words, when the curvature radius c of the curved substrate is 60 mm, the ratio r of the second thickness T2 of the gap compensation layer to the first thickness T1 of the dielectric layer should be at least greater than 0.3.

Based on the results shown in Table 1, the correlations between the second thickness T2 of the gap compensation layer and the corresponding interface stress S in Embodiments 7-11 are plotted as a first correlation graph shown in FIG. 3B. Next, according to the first correlation graph, a first regression curve (the dotted line in FIG. 3B) is drawn, and an equation of the first regression curve (i.e., the first relationship between the second thickness T2 of the gap compensation layer and the interface stress S) is calculated as $S=0.0006 \times T2^2-0.0167 \times T2+0.1894$. From the first relationship, it may be learned that when the curvature radius c of the curved substrate in the IME device is 40 mm and the first thickness T1 of the dielectric layer is 10 μm, the second thickness T2 of the gap compensation layer should be at least 7 μm to avoid the interface stress S from being greater than 0.1 MPa. In other words, when the curvature radius c of the curved substrate is 40 mm, the ratio r of the second thickness T2 of the gap compensation layer to the first thickness T1 of the dielectric layer should be at least greater than 0.7.

Based on the results shown in Table 1, the correlations between the second thickness T2 of the gap compensation layer and the corresponding interface stress S in Embodiments 12-18 are plotted as a first correlation graph shown in FIG. 3C. Next, according to the first correlation graph, a first regression curve (the dotted line in FIG. 3C) is drawn, and an equation of the first regression curve (i.e., the first relationship between the second thickness T2 of the gap compensation layer and the interface stress S) is calculated as $S=-0.0004 \times T2^2-0.0029 \times T2+0.1677$. From the first relationship, it may be learned that when the curvature radius c of the curved substrate in the IME device is 20 mm and the first thickness T1 of the dielectric layer is 10 μm, the second thickness T2 of the gap compensation layer should be at least 11 μm to avoid the interface stress S from being greater than 0.1 MPa. In other words, when the curvature radius c of the curved substrate is 20 mm, the ratio r of the second thickness T2 of the gap compensation layer to the first thickness T1 of the dielectric layer should be at least greater than 1.1.

Based on the above results, the correlations between the curvature radius c and the corresponding ratio r are plotted as a second relationship graph shown in FIG. 4. Next, a second regression curve (the dotted line in FIG. 4) is drawn according to the second relationship graph, and an equation of the second regression curve (i.e., the second relationship between the curvature radius c and the ratio r) is calculated as $r=(1.5-0.02c)\pm15\%$, where the smaller the curvature radius c, the larger the ratio r.

Experimental Example 2

In this experimental example, changes in an interface stress of the IME device in different embodiments (Embodiments 19-27) are measured to verify the relationship between the curvature radius c and the ratio r in Experimental example 1 is applicable to the IME devices provided in other different embodiments.

Materials used in Embodiments 19-27 are the same as those used in Embodiments 1-18, while the difference therebetween lies in that the first thickness T1 of the dielectric layer and the thickness of the second conductive layer are increased to 20 μm in this Experimental example. Here, the curvature radius c of the curved substrate, the first thickness T1 of the dielectric layer, the thickness of the first conductive layer, the second thickness T2 of the gap compensation layer, and the thickness of the second conductive layer applied in different embodiments are all recorded in Table 2. The results of the interface stress S measured in different embodiments are also recorded in Table 2.

TABLE 2

| Embodiment | c (mm) | T1 (μm) | Thickness of the first conductive layer (μm) | T2 (μm) | Thickness of the second conductive layer (μm) | S (Mpa) |
|---|---|---|---|---|---|---|
| 19 | 60 | 20 | 10 | 6 | 20 | 0.05 |
| 20 | | | | 7-11 | | 0.04 |
| 21 | | | | 12-15 | | 0.03 |
| 22 | 40 | 20 | 10 | 14 | 20 | 0.08 |
| 23 | | | | 15-17 | | 0.06 |
| 24 | | | | 18-20 | | 0.04 |
| 25 | 20 | 20 | 10 | 22 | 20 | 0.09 |
| 26 | | | | 23-27 | | 0.08 |
| 27 | | | | 28-30 | | 0.08 |

From the first relationship $r=(1.5-0.02c)\pm15\%$ between the curvature radius c and the ratio r obtained in Experimental example 1, it may be learned that when the curvature radius c of the curved substrate in the IME device is 60 mm and the first thickness T1 of the dielectric layer is 20 μm, the second thickness T2 of the gap compensation layer should be at least 6 μm to avoid the interface stress S from being greater than 0.1 MPa; when the curvature radius c of the curved substrate in the IME device is 40 mm and the first thickness T1 of the dielectric layer is 20 μm, the second thickness T2 of the gap compensation layer should be at least 14 μm to avoid the interface stress S from being greater than 0.1 MPa; when the curvature radius c of the curved substrate in the IME device is 20 mm and the first thickness T1 of the dielectric layer is 20 μm, the second thickness T2 of the gap compensation layer should be at least 22 μm to avoid the interface stress S from being greater than 0.1 MPa.

As may be seen from the results in Table 2, when the curvature radius c is 60 mm and the first thickness T1 of the dielectric layer is 20 μm, the gap compensation layer having the second thickness T2 of 6 μm, 7 μm-11 μm, or 12 μm-15 μm indeed prevents the interface stress S from being greater than 0.1 MPa, thus satisfying the predicted results obtained by applying the relationship $r=(1.5-0.02c)\pm15\%$. When the curvature radius c is 40 mm and the first thickness T1 of the dielectric layer is 20 μm, the gap compensation layer having the second thickness T2 of 14 μm, 15 μm-17 μm, or 18 μm-20 μm indeed prevents the interface stress S from being greater than 0.1 MPa, thus satisfying the predicted results obtained by applying the relationship $r=(1.5-0.02c)\pm15\%$. When the curvature radius c is 20 mm and the first thickness T1 of the dielectric layer is 20 μm, the gap compensation layer having the second thickness T2 of 22 μm, 23 μm-27 μm, or 28 μm-30 μm indeed prevents the interface stress S from being greater than 0.1 MPa, thus satisfying the predicted results obtained by applying the relationship $r=(1.5-0.02c)\pm15\%$.

Experimental Example 3

In this experimental example, changes in an interface stress of the IME device in different embodiments (Embodiments 28-36) are measured to verify the relationship between the curvature radius c and the ratio r in Experimental example 1 is applicable to the IME devices provided in other different embodiments.

Materials used in Embodiments 28-36 are the same as those used in Embodiments 1-18, while the difference therebetween lies in that the first thickness T1 of the dielectric layer and the thickness of the second conductive layer are increased to 30 μm in this Experimental example. Here, the curvature radius c of the curved substrate, the first thickness T1 of the dielectric layer, the thickness of the first conductive layer, the second thickness T2 of the gap compensation layer, and the thickness of the second conductive layer applied in different embodiments are all recorded in Table 3. The results of the interface stress S measured in different embodiments are also recorded in Table 3.

TABLE 3

| Embodiment | c (mm) | T1 (μm) | Thickness of the first conductive layer (μm) | T2 (μm) | Thickness of the second conductive layer (μm) | S (Mpa) |
|---|---|---|---|---|---|---|
| 28 | 60 | 30 | 10 | 9 | 30 | 0.03 |
| 29 | | | | 10-14 | | 0.02 |
| 30 | | | | 15-30 | | 0.02 |
| 31 | 40 | 30 | 10 | 21 | 30 | 0.05 |
| 32 | | | | 22-26 | | 0.04 |
| 33 | | | | 27-30 | | 0.02 |
| 34 | 20 | 30 | 10 | 33 | 30 | 0.05 |
| 35 | | | | 34-36 | | 0.05 |
| 36 | | | | 37-40 | | 0.04 |

From the first relationship $r=(1.5-0.02c)\pm15\%$ between the curvature radius c and the ratio r obtained in Experimental example 1, it may be learned that when the curvature radius c of the curved substrate in the IME device is 60 mm and the first thickness T1 of the dielectric layer is 30 μm, the second thickness T2 of the gap compensation layer should be at least 9 μm to avoid the interface stress S from being greater than 0.1 MPa; when the curvature radius c of the curved substrate in the IME device is 40 mm and the first thickness T1 of the dielectric layer is 30 μm, the second thickness T2 of the gap compensation layer should be at least 21 μm to avoid the interface stress S from being greater than 0.1 MPa; when the curvature radius c of the curved substrate in the IME device is 20 mm and the first thickness T1 of the dielectric layer is 30 μm, the second thickness T2 of the gap compensation layer should be at least 33 μm to avoid the interface stress S from being greater than 0.1 MPa.

As may be seen from the results in Table 3, when the curvature radius c is 60 mm and the first thickness T1 of the dielectric layer is 30 μm, the gap compensation layer having the second thickness T2 of 9 μm, 10 μm-14 μm, or 15 μm-30 μm indeed prevents the interface stress S from being greater than 0.1 MPa, thus satisfying the predicted results obtained by applying the relationship $r=(1.5-0.02c)\pm15\%$. When the curvature radius c is 40 mm and the first thickness T1 of the dielectric layer is 30 μm, the gap compensation layer having the second thickness T2 of 21 μm, 22 μm-26 μm, or 27 μm-30 μm indeed prevents the interface stress S from being greater than 0.1 MPa, thus satisfying the predicted results obtained by applying the relationship $r=(1.5-0.02c)\pm15\%$. When the curvature radius c is 20 mm and the first thickness T1 of the dielectric layer is 30 μm, the gap compensation layer having the second thickness T2 of 33 μm, 34 μm-36 μm, or 37 μm-40 μm indeed prevents the interface stress S from being greater than 0.1 MPa, thus satisfying the predicted results obtained by applying the relationship $r=(1.5-0.02c)\pm15\%$.

To sum up, in the IME device provided in one or more embodiments of the disclosure, by arranging the gap compensation layer and ensuring the second thickness of the gap compensation layer to satisfy the relationship: $r=(1.5-0.02c)\pm15\%$ (where r is the ratio of the second thickness of the gap compensation layer to the first thickness of the dielectric layer, and c is the curvature radius of the curved substrate), the IME device provided in one or more embodiments of the disclosure is able to mitigate the issue of the abnormal interface structure (e.g., peeling or wrinkles) caused by the heating and molding process, thereby enhancing the reliability for the IME device provided in one or more embodiments of the disclosure. In addition, according to some embodiments, the issue of the abnormal interface structure (e.g., peeling or wrinkles) caused by the thermoforming process at the structural gap may be mitigated by arranging the gap compensation layer between the second portion of the second conductive layer and the other portion of the first conductive layer, ensuring the second portion of the second conductive layer to overlap the gap compensation layer in the Y direction, and aligning the second side surface of the second conductive layer with the side surface of the gap compensation layer away from the dielectric layer, thereby improving the reliability of the IME device having the gap compensation layer.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An in-mold electronic device, comprising:
a curved substrate, having a first surface;
a first conductive layer, disposed on the first surface;
a dielectric layer, disposed on the first conductive layer and having a first thickness;
a gap compensation layer, disposed on the first surface, connected to the dielectric layer, and having a second thickness; and
a second conductive layer, disposed on the gap compensation layer and electrically connected to the gap compensation layer,
wherein a curvature radius of the curved substrate is c, a ratio of the second thickness to the first thickness is r, and c and r satisfy a relationship: $r=(1.5-0.02c)\pm15\%$, where the smaller the curvature radius c, the larger the ratio r.

2. The in-mold electronic device according to claim 1, wherein the first surface is a convex surface, a concave surface, or a combination thereof.

3. The in-mold electronic device according to claim 1, wherein an interface is present between the second conductive layer and the gap compensation layer.

4. The in-mold electronic device according to claim 1, wherein the curvature radius is less than or equal to 60 mm.

5. The in-mold electronic device according to claim 1, wherein the first conductive layer, the second conductive layer, and the gap compensation layer have a same material.

6. The in-mold electronic device according to claim 1, wherein a material of the gap compensation layer comprises metal.

7. The in-mold electronic device according to claim 1, wherein a material of the curved substrate comprises polyethylene terephthalate, poly (ethylene terephthalateco-1,4-cylclohexylenedimethylene terephthalate), polycarbonate, polyimide, polymethylmethacrylate, polyethersulfone, polydimethylsiloxane, acrylonitrile-butadiene-styrene copolymer, acrylic, or a combination thereof.

8. The in-mold electronic device according to claim 1, wherein a thickness of the curved substrate ranges from 0.1 mm to 5 mm.

9. The in-mold electronic device according to claim 1, wherein a Young's modulus of the curved substrate ranges from 0.5 GPa to 20 GPa.

10. The in-mold electronic device according to claim 1, wherein a material of the first conductive layer and the second conductive layer comprises gold, silver, copper, aluminum, nickel, tin, an alloy thereof, or a combination thereof.

11. The in-mold electronic device according to claim 1, wherein a material of the dielectric layer comprises acrylic, epoxy resin, phenol, polyester, urethane, silicone, or poly-imide.

12. The in-mold electronic device according to claim 1, wherein the second conductive layer is electrically con-nected to the first conductive layer through the gap com-pensation layer.

13. The in-mold electronic device according to claim 1, wherein the second conductive layer is electrically indepen-dent from the first conductive layer.

14. The in-mold electronic device according to claim 1, wherein the gap compensation layer is disposed between the second conductive layer and the first conductive layer.

15. The in-mold electronic device according to claim 1, wherein the gap compensation layer contacts the first surface of the curved substrate.

16. The in-mold electronic device according to claim 1, wherein the second conductive layer has a first side surface and a second side surface opposite to each other, the first side surface is aligned with a side surface of the dielectric layer away from the gap compensation layer, and the second side surface is aligned with a side surface of the gap compensation layer away from the dielectric layer.

\* \* \* \* \*